United States Patent [19]

D'Ambrisi

[11] Patent Number: 4,911,802
[45] Date of Patent: * Mar. 27, 1990

[54] CONVERSION OF MANGANATE TO PERMANGANATE

[75] Inventor: Joseph J. D'Ambrisi, Trumbull, Conn.

[73] Assignee: MacDermid, Incorporated, Waterbury, Conn.

[ * ] Notice: The portion of the term of this patent subsequent to Aug. 1, 2006 has been disclaimed.

[21] Appl. No.: 329,014

[22] Filed: Mar. 27, 1989

Related U.S. Application Data

[63] Continuation-in-part of Ser. No. 165,752, Mar. 9, 1988, Pat. No. 4,853,095.

[51] Int. Cl.$^4$ .............................................. C25B 1/28
[52] U.S. Cl. ........................................ 204/82; 204/86; 156/642
[58] Field of Search .................................... 204/82, 86

[56] References Cited

U.S. PATENT DOCUMENTS 3,986,941 10/1976 Okabe et al. .......................... 204/82

Primary Examiner—John F. Niebling
Assistant Examiner—David G. Ryser
Attorney, Agent, or Firm—St. Onge Steward Johnston & Reens

[57] ABSTRACT

An electrolytic oxidation process for producing alkali metal permanganate from alkali metal manganate, and particularly for effecting such production to regenerate a permanganate working bath, such as used in desmearing, etch-back or cleaning processes in the manufacture of printed circuits, which has reached a level of decreased working efficiency, wherein an aqueous alkaline soluiton of manganate in alkali metal hydroxide is electrolytically oxidized using a non-sacrificial anode and a cathode compised of an alkali-resistant electrode immersed in a concentrated aqueous solution of sodium hydroxide in a container porous to ions.

20 Claims, 1 Drawing Sheet

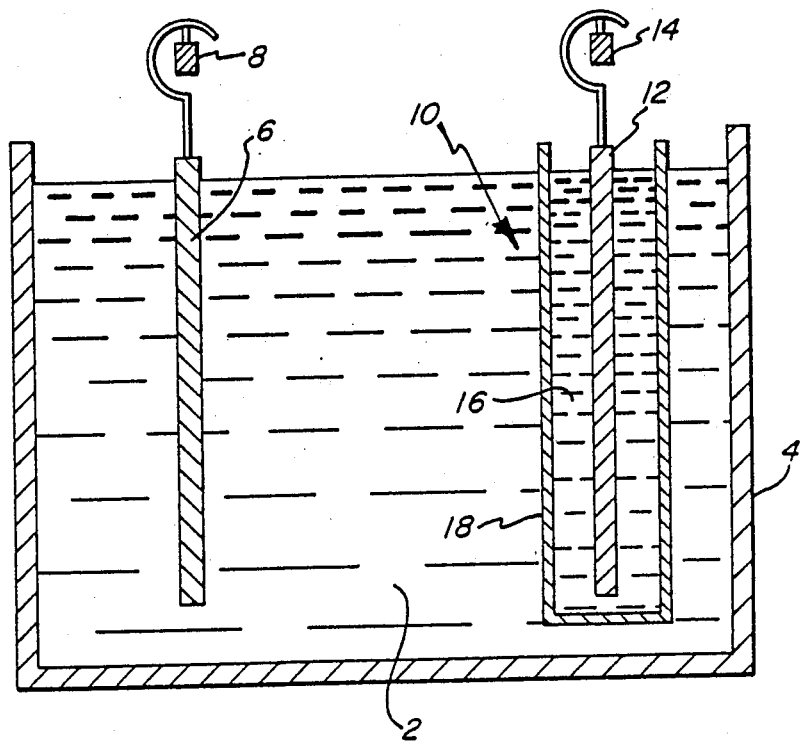

CONVERSION OF MANGANATE TO PERMANGANATE

CROSS-REFERENCE TO RELATED APPLICATION

This application is a continuation-in-part of application Ser, No. 165,752 filed Mar. 9, 1988, now U.S. Pat. No. 4,853,095.

BACKGROUND OF THE INVENTION

The present invention relates to the conversion of alkali metal manganate to alkali metal permanganate by means of electrolytic oxidation, and more particularly to the regeneration of an alkali metal permanganate working bath, such as used in processes for the manufacture of printed circuits, whose effectiveness has been diminished by reason of decrease in alkali metal permanganate concentration arising due, at least in part, to reduction of the alkali metal permanganate to alkali metal manganate.

In the manufacture of printed circuits, particularly multi-layer printed circuits, alkaline solutions of alkali metal permanganate (e.g., potassium permanganate, sodium permanganate) have found use in the desmearing and/or etching back and/or cleaning of substrate surfaces, particularly through-hole surfaces, to prepare them for subsequent metallization. See, for example, British Patent Specification No. 1,479,556; U.S. Pat. No. 4,424,380; U.S. Pat. No. 4,515,829; U.S. Pat. No. 4,592,852; U.S. Pat. No. 4,597,988; U.S. Pat. No. 4,601,783; U.S. Pat. No. 4,601,784; U.S. Pat. No. 4,698,124; published PCT Patent Application No. WO 85/05755; Kukanskis, "Improved Smear Removal Process For Multilayer Circuit Boards", IPC Technical Paper No. 435 (October 1982); and F. Tomaivolo, et al., "Alkaline Permanganate Treatment In Etch-Back Processes", Trans. IMF, 1986, 64, 80.

In the desmearing and/or etch-back and/or cleaning process, the mechanism is essentially one of oxidation and, as a consequence, there is corresponding reduction of the manganese species in the working alkali metal permanganate solution (i.e., $Mn^{+7}$) to manganese species of lower oxidation state, such as Mn(VI) and Mn(IV), in the form, respectively, of the corresponding alkali metal manganate and manganese dioxide. Indeed, this reduction, particularly to Mn(VI), also can occur spontaneously via disproportionation in the typical highly alkaline permanganate solutions employed in such processes.

Since the effectiveness of the alkaline permanganate working bath in desmearing, etch-back, cleaning and other like functions is substantially dependent upon the concentration of permanganate species in the bath, the reduction and/or disproportionation reactions, occurring during the work or spontaneously, reduce the operating efficiency of the bath. As such, it is necessary to either discard the bath and employ a newly-prepared bath of adequate permanganate concentration or to add new permanganate to the bath to increase permanganate concentration therein. In either case, added expense obviously is involved and even in the latter case, concentrations of reduction products remaining in the bath eventually become so high as to preclude effective replenishment just by adding additional permanganate.

In recognition of these problems, the art has proposed regenerating such reduced permanganate concentration working baths, and/or prolonging the useful operating life of such baths, by the addition thereto of a chemical oxidizing agent capable, at least in theory, of oxidizing the reduction products (e.g., manganate, manganese dioxide) back to the permanganate species. See in this regard U.S. Pat. Nos. 4,592,852; 4,629,636; and 4,698,124. The obvious problem with procedures of this type is the need to add often expensive chemical ingredients to the bath, often in fairly large amounts, thereby increasing the cost of operation and running risk that the chemicals or their by-products may eventually lead to problems in bath operation or eventually preclude further regeneration in this manner.

As is discussed in further detail hereinafter, the present invention avoids these problems by utilization of electrolytic oxidation to convert reduced manganese species, such as manganate, to the desired permanganate species, thereby regenerating the permanganate working bath. In addition, the invention provides a means, wholly apart from the context of regeneration of working permanganate baths, for producing permanganate from manganate.

As such, additional background art of interest includes Okabe, et al., U.S. Pat. No. 3,986,941, who describe the preparation of an alkali metal permanganate in high purity by electrolytic oxidation of a slurry of manganese dioxide or alkali metal manganate in caustic alkali having a concentration in the range of 10 to 25 percent by weight at temperatures higher than about 60° C., which conditions are stated to be critical to successful operation of the process; Mazuchelli, et al., U.S. Pat. No. 3,293,160, who describe the electrolytic manufacture of manganates and/or permanganates utilizing a sacrificial anode comprised of manganese metal deposited on a conductive core; and Innes, et al., "Plating And Surface Finishing", November 1978, pp. 36–40, who describe the electrolytic regeneration of chromic acid baths employed to etch ABS plastics using a metal tin-lead anode and a cathode comprising a copper electrode immersed in a 4.6 N sulfuric acid solution contained in a porous ceramic container.

SUMMARY OF THE INVENTION

In its broadest aspects, the present invention comprises a process for producing permanganate (e.g., sodium or potassium permanganate) by electrolytic oxidation of manganate in the presence of alkali metal hydroxide, employing a non-sacrificial anode and a cathode which comprises an alkali-resistant electrode immersed in a concentrated aqueous solution of an alkali metal hydroxide in a container porous to ions.

According to the preferred embodiment of the invention, the invention relates to the treatment of an alkaline permanganate working bath which has reached a level of decreased working efficiency by reason of diminished concentration of permanganate therein due at least in part to reduction of the permanganate species to manganate ($Mn^{+6}$), such treatment involving subjecting the bath to electrolytic oxidation to convert at least a portion of the manganate to permanganate by use of a non-sacrificial anode and a cathode which comprises an alkali-resistant electrode immersed in a concentrated aqueous solution of an alkali metal hydroxide in a container porous to ions.

As used hereinabove and hereinafter, a permanganate "working" bath is used generically to describe alkaline permanganate baths employed as desmearing solutions, etchants, cleaners, and the like in which the work has the tendency of promoting reduction of at least a portion of the permanganate to manganate. Hence, "decreased working efficiency" describes a condition where the permanganate bath has either entirely ceased being effective to perform its intended function or has ceased performing such function efficiently (e.g., decreased rate of etching and the like).

BRIEF DESCRIPTION OF THE DRAWINGS

FIG. 1 is a cross-sectional, partly schematic representation illustrating an electrolytic cell for carrying out the process of the invention.

DETAILED DESCRIPTION OF THE INVENTION

In carrying the process of the invention in its broadest aspect, namely the conversion of an alkali metal manganate to an alkali metal permanganate, the alkali metal manganate is dissolved in an aqueous solution of an alkali metal hydroxide, the alkali metal ion of which may or may not correspond to the alkali metal ion in the permanganate salt to be generated. The alkali metal hydroxide solution is advantageously of a concentration corresponding to about 0.1 N to about 3.0 N and preferably from about 0.5 N to about 1.5 N. The amount of alkali metal manganate present in the solution is not critical as such. The upper limit of the amount of alkali metal manganate present in any given instance is governed by its solubility in the aqueous solution of alkali metal hydroxide at the operating temperature of the process, and by the solubility of the resulting alkali metal permanganate in the aqueous solution at the temperature employed in the process of the invention. Illustratively, one part by weight of potassium permanganate is soluble in 14.2 parts by weight of water at about 25° C., but is soluble in only 3.5 parts of water at the boiling point. Sodium permanganate has much greater solubility in both cold and hot water.

The aqueous solution of alkali metal manganate and alkali metal hydroxide is placed in a suitable vessel which is preferably provided with agitation means such as a stirrer or stirrers for maintaining homogeneity in the solution. The electrolytic oxidation of the alkali metal manganate is carried out using any type of non-sacrificial anode conventionally employed in the art, but employing a particular type of cathode the nature of which is the key to the success of the process of the invention. Thus the anode can be fabricated of carbon, or metals such as aluminum, titanium and the like coated with rare earth oxides.

The cathode comprises an electrode which is resistant to attack by alkali metal hydroxide and which is immersed in a concentrated aqueous solution of alkali metal hydroxide contained in a vessel which will permit passage of ions through the walls thereof. Illustrative of the alkali resistant material from which the electrode is fabricated are stainless steel, carbon, aluminum, titanium and the like coated with rare earth oxides. The alkali metal hydroxide solution employed in the cathode advantageously has a concentration of alkali metal hydroxide of about 10 N to about 25 N and preferably from about 18 N to about 20 N. The vessel in which the electrode and concentrated alkali metal hydroxide are housed is fabricated advantageously from porous ceramic, sintered glass, porous, alkali-resistant polymeric diaphragms (e.g., Nafion$^R$ membranes, available from E. I. duPont deNemours & Co.) and the like. The actual shape and dimensions of the container are not critical.

A typical example of an electrolytic cell for use in carrying out the process in accordance with the invention is shown in cross-sectional schematic form in FIG. 1. Cell 4 contains the solution 2 of alkali metal manganate in aqueous alkali metal hydroxide solution having a concentration within the limits set forth above. Anode 6 is typically a carbon electrode and is connected to and suspended from anode bus bar 8. The cathode, shown generally as 10, comprises an electrode 12, typically of stainless steel, connected to and suspended from cathode bus bar 14. The electrode 12 is suspended in a 50 percent by weight aqueous solution 16 of alkali metal hydroxide which is contained in cylindrical pot 18. The latter is fabricated from porous material, as earlier described, which permits passage of ions through the wall thereof, such as the earlier-noted Nafion$^R$ membranes or a porous ceramic pot such as is available commercially from Ferro Corp., Cleveland, Ohio.

Advantageously the same alkali metal hydroxide (but in different concentrations) is employed in the solution 2 and the cathode solution 16. In a preferred embodiment the alkali metal hydroxide in both solutions is sodium hydroxide. The electrolytic oxidation of the solution 2 of alkali metal manganate is carried out advantageously using a current concentration of about 10 to about 100 amps/liter. However, this range is offered for purposes of illustration and is not to be construed as limiting. In general the higher the current concentration the shorter the time required for generation of the permanganate. The electrolytic conditions employed in any given instance may vary depending upon factors such as the amount of alkali metal manganate in the solution, the concentration of alkali metal hydroxide in the solution and the like. One condition which influences the rate at which the oxidation takes place is the temperature of the solution 2. In general it is found that, using a current concentration in the lower end of the above range, the desired oxidation proceeds at a rate which may be too slow to be of practical commercial value if the solution is maintained at ambient temperature. Advantageously, depending upon the current concentration employed, the temperature of the dispersion is maintained in the region of about 50° C. to about 80° C. and preferably of the order of about 65° C. to about 75° C. during the electrolytic operation. However, temperatures above or below these ranges can be employed if desired. The upper limit of temperature is restricted only by the boiling point of the solution.

The addition of a catalytic amount of an oxidizing agent such as an alkali permanganate to the solution 2 greatly facilitates the efficiency of operation at the beginning of the electrolytic oxidation.

The electrolytic oxidation preferably is continued until substantially all the alkali metal manganate has been converted to alkali metal permanganate. The end point can be detected by routine analytical procedures such as titration of aliquots to determine the concentration of permanganate therein. Visual observation of an aliquot will also indicate disappearance of manganate. If desired, the permanganate can be isolated from the resulting solution by conventional means such as crystallization. The permanganate may be contaminated will small amounts of the manganate, but the permanganate can be purified by recrystallization or like conventional techniques.

In the preferred embodiment of the invention, the solution of alkali metal manganate in alkali metal hydroxide pre-exists in the form of an alkaline permanganate working bath in which at least a portion of the permanganate has been reduced to manganate as a consequence of the work performed and/or spontaneous disproportionation. Such working baths, when initially prepared, generally comprise an alkali metal permanganate, present in an amount close to its limit of solubility, in an aqueous solution of alkali metal hydroxide present in an amount in the range of from about 2 to 5 percent by weight (pH preferably above about 12). Alkali metal manganate may also be present in the initial bath either by deliberate addition or by reason of spontaneous disproportionation. As such baths perform their intended work, be it desmearing or etching or cleaning or the like, and/or await use, the concentration of alkali permanganate therein decreases and the concentration of alkali metal manganate increases. The reduction may also bring about formation of a quantity of still lower oxidation state manganese species, such as the generally insoluble manganese dioxide. Since these reduced species have essentially no utility in desmearing, etching, or the like, the working bath decreases in its efficiency as a result of the reduced permanganate concentration.

According to the invention, such baths are brought back to useful permanganate concentration by subjecting the bath, either in its original vessel or in a different vessel, and with or without prior removal of any insoluble species (e.g., manganese dioxide), to the electrolytic oxidation process as earlier described involving a non-sacrificial anode, a cathode comprised of an alkali-resistant electrode immersed in a concentrated solution of alkali metal hydroxide in a container porous to ions, and a DC current therebetween, all at the conditions, concentrations and the like previously set forth. Typically, the alkali metal hydroxide content of the bath will be sufficient to provide the typical 0.1 N to 3.0 N bath concentration earlier set forth, but if not, additional hydroxide can be added to this end. The electrolytic oxidation is continued until all or a desired portion of the alkali metal manganate has been oxidized to permanganate, at which point the bath, now with replenished permanganate concentration, can be employed as an etchant or the like.

EXAMPLE

An aqueous alkaline potassium permanganate etchant bath (total volume of thirty (30) gallons) was made up at 63.9 g/l. potassium permanganate, 10 g/l. potassium manganate, and 57 g/l. sodium hydroxide.

With the bath at a temperature of about 160° F., FR-4 epoxy laminate (i.e., a substrate material commonly employed in printed circuit manufacture) was placed in the bath and removed after five (5) hours. As a consequence of its oxidation etching of the epoxy, the concentration of permanganate in the bath had dropped to 33.0 g/l. while the concentration of potassium manganate rose to 39.4 g/l.

A carbon anode (surface area of 5.35 ft$^2$) was then immersed in the bath (in the same vessel as originally contained) along with a cathode element comprised of a Nafion$^R$ membrane in the form of a cylindrical container (surface area of 2.82 ft$^2$) and in which was arranged a 50% NaOH solution and a stainless steel electrode. A DC current of 40 amps was employed, and the electrolysis continued for 11 hours with periodic replenishment of NaOH in the cathode container to maintain a concentration of 18-20 N.

At the conclusion of the electrolytic process, the bath was analyzed as 66.9 g/l. potassium permanganate, 1.0 g/l. potassium manganate, and 63.8 g/l. NaOH.

Similar results are obtained using baths originally made up with sodium permanganate.

What is claimed is:

1. A process for producing alkali metal permanganate from alkali metal manganate, comprising subjecting an aqueous solution comprised of alkali metal manganate and alkali metal hydroxide to electrolytic oxidation by means of a non-sacrificial anode immersed in said aqueous solution comprised of alkali metal manganate and alkali metal hydroxide, and a cathode, also immersed in said aqueous solution comprised of alkali metal manganate and alkali metal hydroxide, comprised of an alkali-resistant electrode immersed in a concentrated aqueous solution of an alkali metal hydroxide in a container porous to ions, said container porous to ions serving as a diaphragm separating said anode and said cathode, so as to convert alkali metal manganate in said aqueous solution comprised of alkali metal manganate and alkali metal hydroxide to alkali metal permanganate.

2. The process according to claim 1 wherein said non-sacrificial anode is a carbon electrode.

3. The process according to claim 1 wherein said alkali-resistant electrode is a stainless steel electrode.

4. The process according to claim 1 wherein said container porous to ions comprises a porous ceramic pot.

5. The process according to claim 1 wherein said container porous to ions is formed of ion-porous polymeric membrane material.

6. The process according to claim 1 wherein the temperature of said aqueous solution of alkali metal manganate and alkali metal hydroxide is from about 50° C. to about 80° C.

7. The process according to claim 1 wherein the concentration of alkali metal hydroxide in said aqueous solution of alkali metal manganate and alkali metal hydroxide is from about 0.1 N to about 3 N.

8. The process according to claim 1 wherein the concentration of said concentrated aqueous solution of alkali metal hydroxide in said container porous to ions is from about 10 N to about 25 N.

9. The process according to claim 1 wherein said alkali metal hydroxide in said solution of alkali metal manganate and alkali metal hydroxide is sodium hydroxide.

10. The process according to claim 9 wherein said alkali metal hydroxide in said concentrated aqueous solution of alkali metal hydroxide is sodium hydroxide.

11. A process for treating an alkaline permanganate working bath which has reached a level of decreased working efficiency by reason of diminished concentration of permanganate therein due at least in part to the reduction of the permanganate to manganate, said process comprising subjecting said alkaline permanganate working bath to electrolytic oxidation by means of a non-sacrificial anode immersed in said alkaline permanganate working bath, and a cathode, also immersed in said alkaline permanganate working bath, comprised of an alkali-resistant electrode immersed in a concentrated aqueous solution of alkali metal hydroxide in a container porous to ions, said container porous to ions serving as a diaphragm separating said anode and said cathode, so as to convert at least a portion of said manganate in said alkaline permanganate working bath to permanganate.

12. The process according to claim 11 wherein said diminished concentration of permanganate is further due to reduction of said permanganate to manganese dioxide.

13. The process according to claim 12 wherein insoluble manganese dioxide present in said alkaline permanganate working bath which has reached a level of decreased working efficiency is removed therefrom prior to subjecting said alkaline permanganate working bath to said electrolytic oxidation.

14. The process according to claim 11 wherein said non-sacrificial anode is a carbon electrode.

15. The process according to claim 11 wherein said alkali-resistant electrode is a stainless steel electrode.

16. The process according to claim 11 wherein said container porous to ions comprises a porous ceramic pot.

17. The process according to claim 11 wherein said container porous to ions is formed of ion-porous polymeric membrane material.

18. The process according to claim 11 wherein the temperature of said alkaline permanganate bath of decreased working efficiency when subjected to said electrolytic oxidation is from about 50° C. to about 80° C.

19. The process according to claim 11 wherein the concentration of alkali metal hydroxide in said alkaline permanganate bath of decreased working efficiency at the time of said electrolytic oxidation is from about 0.1 N to about 3 N.

20. The process according to claim 11 wherein the concentration of said concentrated aqueous solution of alkali metal hydroxide in said container porous to ions is from about 10 N to about 25 N.

* * * * *